US008169321B2

(12) United States Patent
Iyer et al.

(10) Patent No.: US 8,169,321 B2
(45) Date of Patent: May 1, 2012

(54) RADIO FREQUENCY-ENABLED ELECTROMIGRATION FUSE

(75) Inventors: Subramanian S. Iyer, Mount Kisco, NY (US); Chandrasekharan Kothandaraman, New York, NY (US); Gerard M. Salem, Willsboro, NY (US)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 12/696,104

(22) Filed: Jan. 29, 2010

(65) Prior Publication Data
US 2011/0187407 A1    Aug. 4, 2011

(51) Int. Cl.
*H03K 19/00* (2006.01)
*G08B 13/14* (2006.01)

(52) U.S. Cl. .................. 340/572.3; 326/16; 257/529
(58) Field of Classification Search .............. 326/37–41; 340/572.3, 572.1; 257/529; 324/537
See application file for complete search history.

(56) References Cited

U.S. PATENT DOCUMENTS

| | | | |
|---|---|---|---|
| 6,624,499 B2 | 9/2003 | Kothandaraman et al. | |
| 6,728,916 B2 * | 4/2004 | Chen et al. | 714/733 |
| 7,072,163 B2 | 7/2006 | McCollough, Jr. | |
| 7,283,390 B2 * | 10/2007 | Pesavento | 365/185.01 |
| 7,298,272 B2 | 11/2007 | Larson et al. | |
| 7,307,534 B2 * | 12/2007 | Pesavento | 340/572.1 |
| 7,986,236 B2 * | 7/2011 | Erikson | 340/572.1 |
| 2002/0178416 A1 * | 11/2002 | Chen et al. | 714/733 |
| 2005/0231320 A1 | 10/2005 | Ackermann | |
| 2005/0289061 A1 * | 12/2005 | Kulakowski et al. | 705/50 |
| 2009/0015414 A1 * | 1/2009 | Paone et al. | 340/572.3 |
| 2009/0243032 A1 * | 10/2009 | Chen | 257/529 |
| 2009/0321735 A1 * | 12/2009 | Cestero et al. | 257/50 |

FOREIGN PATENT DOCUMENTS

JP  2006186984  7/2006

* cited by examiner

*Primary Examiner* — Shawki S Ismail
*Assistant Examiner* — Dylan White
(74) *Attorney, Agent, or Firm* — Yuanmin Cai; Hoffman Warnick LLC

(57) ABSTRACT

Embodiments of the invention provides a method, device, and system for programming an electromigration fuse (eFuse) using a radio frequency (RF) signal. A first aspect of the invention provides a method of testing circuitry on a semiconductor chip, the method comprising: receiving a radio frequency (RF) signal using at least one antenna on the semiconductor chip; powering circuitry on the semiconductor chip using the RF signal; activating a built-in self test (BIST) engine within the circuitry; determining whether a fault exists within the circuitry using the BIST; and programming an electromigration fuse (eFuse) to alter the circuitry in response to a fault being determined to exist.

15 Claims, 4 Drawing Sheets

RADIO FREQUENCY-ENABLED ELECTROMIGRATION FUSE

TECHNICAL FIELD

The present invention relates generally to integrated circuits and, more particularly, to the use of a radio frequency (RF) signal to supply power to a semiconductor chip and read and/or write its circuitry using an electromigration fuse (eFuse).

BACKGROUND OF THE INVENTION

In integrated circuits, it may be desirable, after the circuit is manufactured, to permanently store information within it, or to form or alter its connections. Fuses or other devices may be used for this purpose. In some cases, a laser is used to open a link in the circuitry of a semiconductor device. However, the use of lasers in such circumstances requires precise, time-consuming alignment of the laser to avoid damaging neighboring circuitry and devices.

Electromigration fuses (eFuses) provide a more recent, less destructive alternative to the use of lasers. In general terms, an eFuse comprises a cathode and an anode connected by a fuse link. The fuse link is comprised of a conductive material, such as a metal or metal silicide, e.g., titanium, tungsten, aluminum, copper, titanium silicide, nickel silicide, etc. A current is applied across the fuse link such that its conductive material electromigrates from one portion of the fuse link to another. The result is a great reduction in the conductivity of the eFuse and a correspondingly great increase in its resistance. Thus, the fuse is "blown" and the circuitry of the semiconductor device is altered or "programmed" (e.g., by disabling circuitry connected to the eFuse, invoking redundant or alternate circuitry of the device, permanently storing information in the eFuse, etc.). While eFuses enable less destructive alteration of a device's circuitry, programming an eFuse requires physical connection to the circuit to provide the necessary power, which is time-consuming, expensive, and limiting of the locations and circumstances in which such programming may be done.

SUMMARY OF THE INVENTION

Embodiments of the invention provide a method, device, and system for programming an electromigration fuse (eFuse) using a radio frequency (RF) signal.

A first aspect of the invention provides a method of testing circuitry on a semiconductor chip, the method comprising: receiving a radio frequency (RF) signal using at least one antenna on the semiconductor chip; powering circuitry on the semiconductor chip using the RF signal; activating a built-in self test (BIST) engine within the circuitry; determining whether a fault exists within the circuitry using the BIST; and programming an electromigration fuse (eFuse) to alter the circuitry in response to a fault being determined to exist.

A method of programming circuitry on a semiconductor chip, the method comprising: receiving a radio frequency (RF) signal using at least one antenna on the semiconductor chip; powering circuitry on the semiconductor chip using the RF signal; and programming an electromigration fuse (eFuse) on the semiconductor chip.

A third aspect of the invention provides a semiconductor chip comprising: a substrate; at least one radio frequency (RF) antenna coupled to the substrate; and circuitry coupled to the at least one antenna, the circuitry including at least one electromigration fuse (eFuse), wherein the eFuse is programmed by an RF signal received by the at least one RF antenna.

A fourth aspect of the invention provides a system for programming an electromigration fuse (eFuse), the system comprising: an eFuse including: a cathode; an anode; and a conductive fuse link coupling the cathode and anode; a radio frequency (RF) transmitter for supplying an RF signal; and an RF antenna coupled to the eFuse for receiving the RF signal and supplying a current sufficient to induce electromigration in the conductive fuse link.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
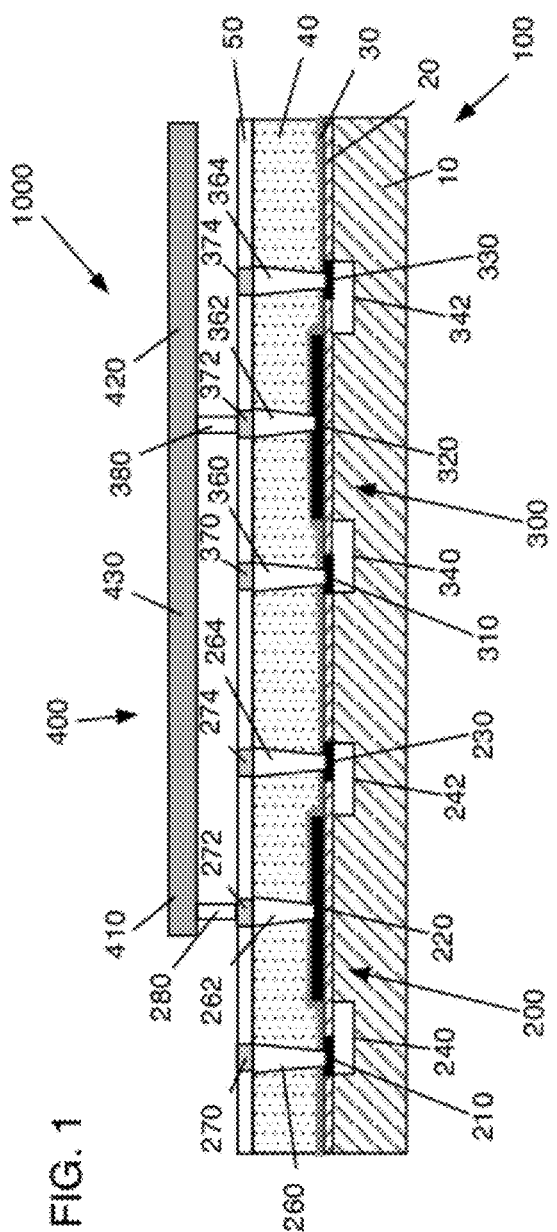
FIG. 1 shows a cross-sectional side view of a portion of a semiconductor device having a programming circuit for programming an electromigration fuse (eFuse), according to an embodiment of the invention.

Referring now to FIG. 1, a cross-sectional side view is shown of a programming circuit 1000 according to one embodiment of the invention, the programming circuit 1000 comprising a semiconductor device 100 and an electromigration fuse (eFuse) 400. Semiconductor device 100 may include a substrate 10 beneath a gate dielectric 20, a nitride liner 30, and insulating layers 40, 50. Into these layers of semiconductor device 100 are formed field effect transistors (FETs) 200, 300.

Substrate 10 may include any of a number of materials, including, but not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions, each greater than or equal to zero and A1+A2+B1+B2=1 (1 being a total mole quantity). Furthermore, a portion or entire semiconductor substrate may be strained.

Gate dielectric 20 is often silicon oxide ($SiO_2$), but may also include, but is not limited to, hafnium silicate (HfSi), hafnium oxide ($HfO_2$), zirconium silicate ($ZrSiO_x$), zirconium oxide ($ZrO_2$), silicon nitride ($Si_3N_4$), silicon oxynitride (SiON), high-k material, or any combination of such materials. Nitride liner 30 is typically silicon nitride ($Si_3N_4$). Insulating layers 40, 50 may also include silicon oxide ($SiO_2$), hafnium silicate (HfSi), hafnium oxide ($HfO_2$), zirconium silicate ($ZrSiO_x$), zirconium oxide ($ZrO_2$), silicon nitride ($Si_3N_4$), silicon oxynitride (SiON), high-k material, or any combination of such materials.

Each FET 200, 300 includes a source 210, 310, a gate 220, 320, and a drain 230, 330, as well as n-type doped regions 240, 340 and 242, 342 beneath the sources 210, 310 and drains 230, 330, respectively. Metal contacts 270, 370, 272, 372, 274, 374 above insulator 40 are connected to the sources 210, 310, gates 220, 320, and drains 230, 330 by a plurality of vias 260, 360, 262, 362, 264, 364, respectively. N-type dopants may include, but are not limited to, phosphorous (P), arsenic (As), antimony (Sb), sulphur (S), selenium (Se), tin (Sn), silicon (Si), and carbon (C).

eFuse 400 comprises an anode 410 and cathode 420 connected by a fuse link 430, each composed of a metal or metal silicide. Anode 410 and cathode 420 are connected to metal contacts 272 and 372, respectively, by metallized vias 280 and 380. As described above, application of a current (supplied by FETs 200, 300) across fuse link 430 causes electromigration of its conductive material. In the case that a metal silicide is employed in eFuse 400, the silicide may be formed using any now-known or later-developed technique. For example, a metal, such as titanium (Ti), nickel (Ni), cobalt (Co), etc., may be deposited on silicon and annealed, followed by removal of any unreacted metal. Such deposition may include any now known or later developed techniques appropriate for the material to be deposited, including, but not limited to, chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Figure 2:
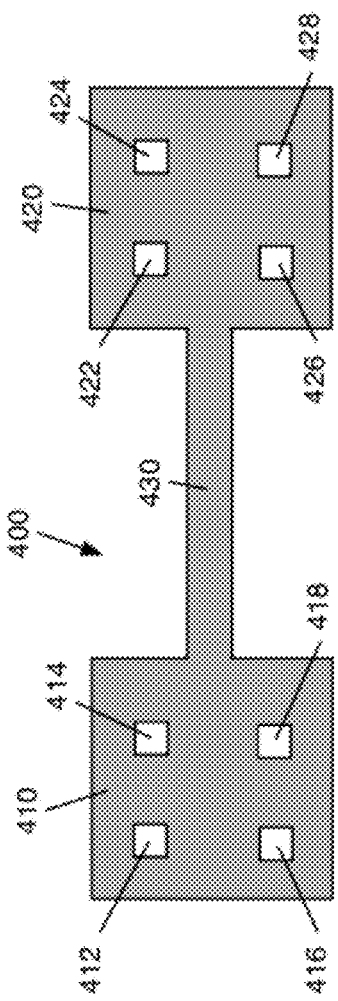
FIG. 2 shows a top-down view of the eFuse of FIG. 1.

FIG. 2 shows a top-down view of eFuse 400. Anode 410 and cathode 420 each include a plurality of contacts 412, 414, 416, 418 and 422, 424, 426, 428, respectively, to which circuitry of the device may be connected.

Figure 3:
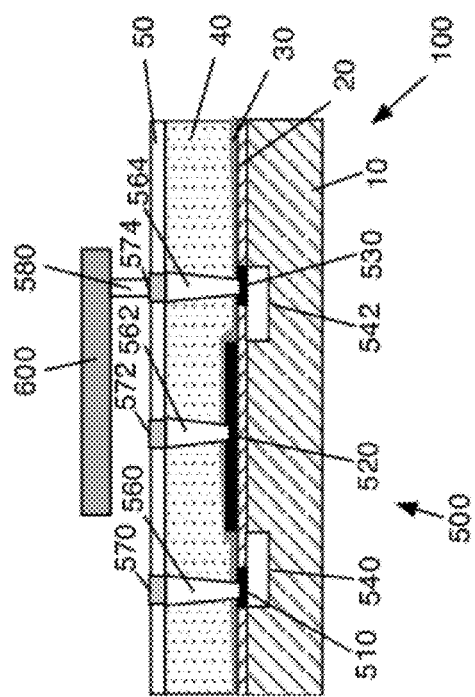
FIG. 3 shows a cross-sectional side view of a portion of a semiconductor device having a radio frequency (RF) antenna, according to an embodiment of the invention.
Figure 4:
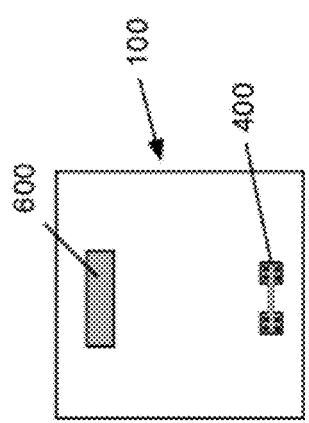
FIG. 4 shows a top-down view of a semiconductor device having an eFuse and an RF antenna, according to an embodiment of the invention.

FIG. 3 shows a cross-sectional side view of another portion of the semiconductor device 100, in which a radio frequency (RF) antenna 600 is connected to a FET 500. Specifically, RF antenna 600 is connected to the drain 530 of FET 500 by metallized via 580. As shown in FIG. 3, RF antenna 600 is connected to a FET 500 other than those to which eFuse 400 (FIG. 1) is connected and, as shown in FIG. 4, is separated from eFuse 400 on semiconductor device 100. This may be desirable, for example, to protect signal integrity, but it is not essential. That is, RF antenna 600 and eFuse 400 may be located nearer each other on semiconductor device 100 than shown in FIG. 4 and/or RF antenna 600 and eFuse 400 may be connected to the same FET (e.g., FET 300, FIG. 1).

In some embodiments of the invention, RF antenna 600 may be formed directly on semiconductor device 100 (i.e., its components may be connected to semiconductor device 100 to form RF antenna 600). In other embodiments of the invention, RF antenna 600 may be assembled separately and connected to semiconductor device 100. This may include, for example, printing the components of RF antenna 600 onto a flexible member, which is then connected to semiconductor device 100.

Figure 5:
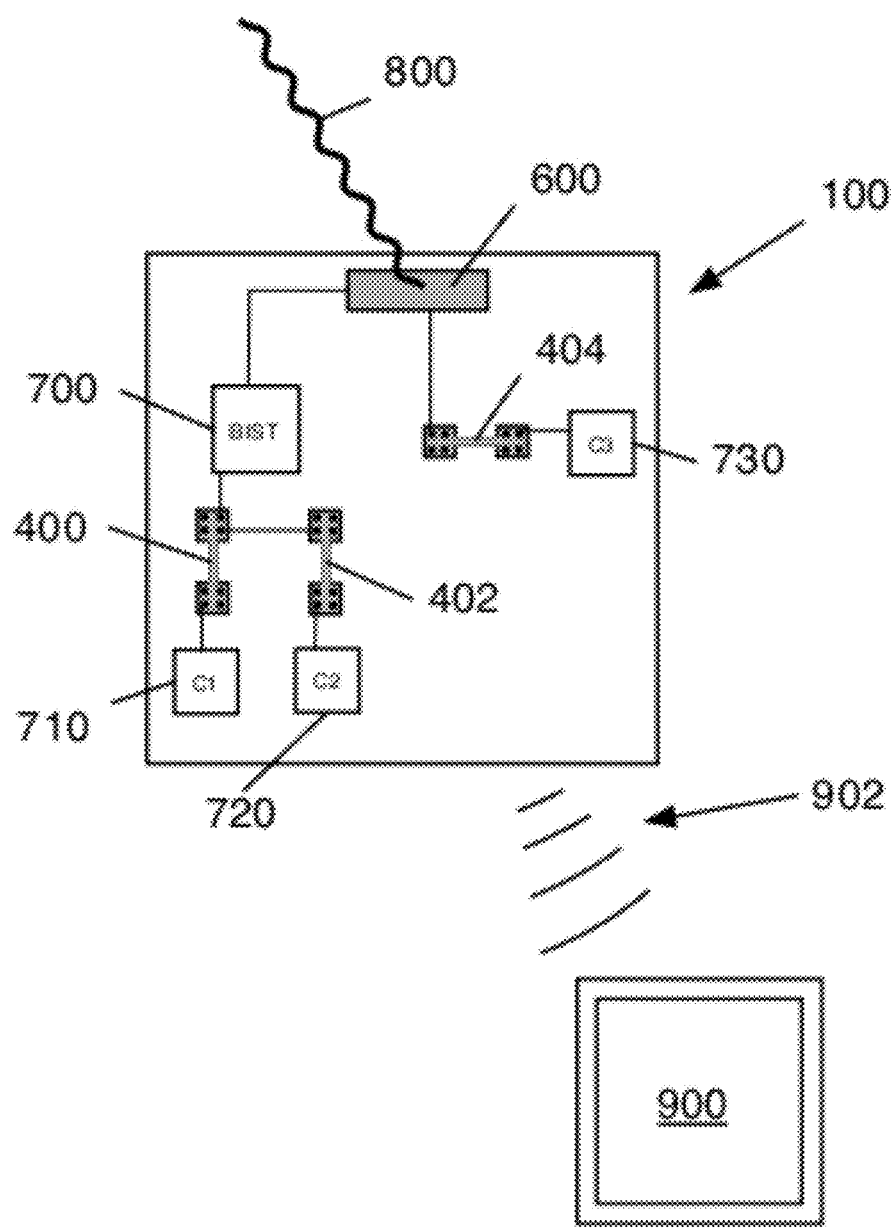
FIG. 5 shows a schematic view of circuitry of a semiconductor device according to an embodiment of the invention.

Referring now to FIG. 5, a schematic of a semiconductor device 100 according to an illustrative embodiment of the invention is shown. Semiconductor device 100 includes an RF antenna 600, a built-in self test (BIST) engine 700, a plurality of eFuses 400, 402, 404, and a plurality of circuits 710 (C1), 720 (C2), 730 (C3). Upon receiving an RF signal 800 from an RF transmitter (not shown), the RF antenna 600 powers the circuitry of semiconductor device 100 and activates BIST engine 700, which tests the circuits (C1, C2, C3) to which it is connected, for faults. Upon determination of a fault, BIST engine 700 may program one or more eFuses 400, 402, 404 (i.e., "blow" the fuse by inducing electromigration in its fuse link), to invoke redundant circuitry, invoke alternate circuitry, and/or disable circuitry. For example, upon determining that a fault exists in circuit 710 (C1), eFuse 400 may be programmed to disable circuit 710 (C1) and invoke circuit 720 (C2), which may provide redundant or alternate circuitry.

In other cases, RF signal 800 may be employed directly to program circuitry. For example, RF signal 800 may be received by RF antenna 600 and used to power (i.e., provide a current to) eFuse 404, thereby inducing electromigration in its fuse link, programming eFuse 404, and disabling circuit 730 (C3). This may be desirable, for example, to permanently store information within circuit 730 (C3) or to disable a functionality provided by circuit 730 (C3) and thereby disable a functionality of an apparatus in which semiconductor device 100 is contained.

In some embodiments of the invention, a signal 902 including information describing a result of a fault determination, eFuse programming, or other relevant events may be transmitted from semiconductor device 100 to, for example, a chip reader 900.

Figure 6:
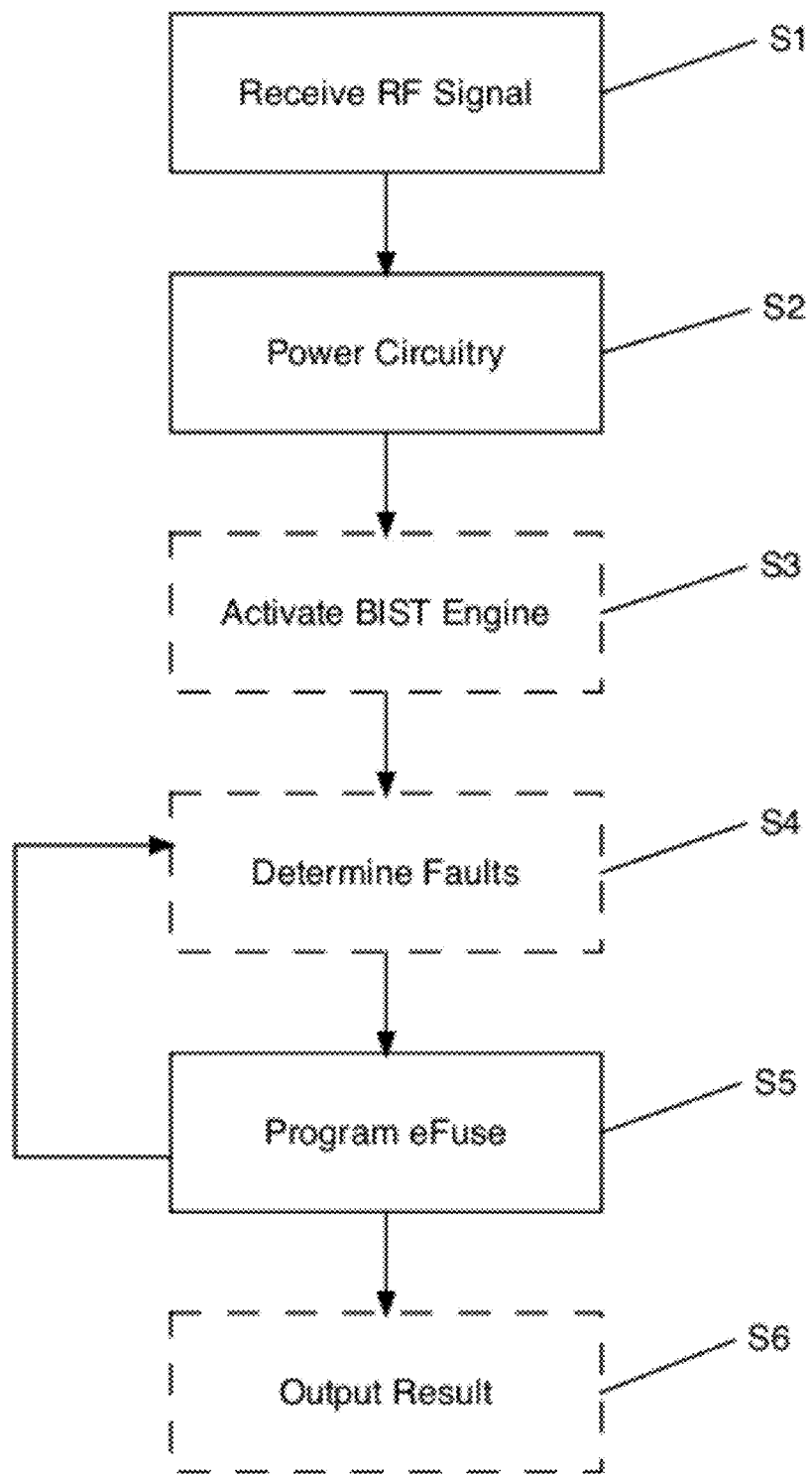
FIG. 6 shows a flow diagram of a method according to an embodiment of the invention.

FIG. 6 shows a flow diagram of a method according to an embodiment of the invention. At S1, an RF signal is received by an RF antenna on a semiconductor device. At S2, the RF signal is used to power the circuitry of the semiconductor device. At S3, powering the circuitry powered may optionally activate a BIST engine, which, at S4, is used to determine whether one or more faults exist within the circuitry. At S5, an eFuse is programmed by applying a current across its fuse link.

As described above, programming the eFuse may be in response to determining that a fault exists within the circuitry (in the case that the BIST engine is employed) or may be carried out directly upon receiving the RF signal. Also as described above, programming the eFuse may include invoking redundant circuitry, invoking alternate circuitry, and/or disabling circuitry. In the case that the BIST engine is employed at S3, determining whether a fault exists at S4 and programming an eFuse at S5 may be iteratively looped until no faults are determined to exist in the circuitry of the semiconductor device.

At S6, a result of the determining and/or the programming may optionally be outputted. For example, such a result may be transmitted to a chip reader.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of programming circuitry on a semiconductor chip, the method comprising:
   receiving a radio frequency (RF) signal using at least one antenna on the semiconductor chip;
   powering circuitry on the semiconductor chip using the RF signal;
   programming an electromigration fuse (eFuse) on the semiconductor chip activating a built-in self test (BIST) engine within the circuitry;
   determining whether a fault exists within the circuitry using the BIST; and
   programming an electromigration fuse (eFuse) to alter the circuitry in response to a fault being determined to exist.

2. The method of claim 1, wherein the programming of the eFuse includes using a field effect transistor (FET).

3. The method of claim 1, wherein the programming the eFuse includes at least one of the following: invoking redundant circuitry, invoking alternate circuitry, or disabling circuitry.

4. The method of claim 1, further comprising:
   outputting a result of the programming.

5. The method of claim 4, wherein the outputting includes transmitting the result to a chip reader.

6. The method of claim 1, further comprising:
   repeating the determining and programming steps until no faults are determined to exist.

7. The method of claim 1, further comprising:
   outputting a result of at least one of the determining or the programming.

8. The method of claim 7, wherein the outputting includes transmitting the result to a chip reader.

9. A semiconductor chip comprising:
   a substrate;
   at least one radio frequency (RF) antenna coupled to the substrate; and
   circuitry coupled to the at least one antenna, the circuitry including at least one electromigration fuse (eFuse), wherein the circuitry includes redundant circuitry, wherein the redundant circuitry is invoked by programming the at least one eFuse using the RF signal, and wherein the eFuse is programmed by an RF signal received by the at least one RF antenna.

10. The semiconductor chip of claim 9, wherein the circuitry includes a built-in self test (BIST) engine for determining whether a fault exists within the circuitry and for programming the at least one eFuse to invoke the redundant circuitry in response to a fault being determined to exist.

11. The semiconductor chip of claim 9, wherein the circuitry includes at least one field effect transistor (FET) for programming the at least one eFuse.

12. The semiconductor chip of claim 9, wherein the circuitry includes alternate circuitry invoked by programming the at least one eFuse using the RF signal.

13. The semiconductor chip of claim 9, wherein at least a portion of the circuitry is disabled by programming the at least one eFuse using the RF signal.

14. A system for programming an electromigration fuse (eFuse), the system comprising:
   an eFuse including:
      a cathode;
      an anode; and
      a conductive fuse link coupling the cathode and anode;
   a radio frequency (RF) transmitter for supplying an RF signal; and
   an RF antenna coupled to the eFuse for receiving the RF signal and supplying a current sufficient to induce electromigration in the conductive fuse link, wherein the eFuse is coupled to circuitry and inducing electromigration in the conductive fuse link results in an invocation of redundant circuitry, and, wherein the redundant circuitry is invoked by the programming of the at least one eFuse using the RF signal.

15. A semiconductor chip comprising:
   a substrate;
   at least one radio frequency (RF) antenna coupled to the substrate; and
   circuitry coupled to the at least one antenna, the circuitry including at least one electromigration fuse (eFuse), wherein the circuitry includes redundant circuitry, wherein the circuitry includes a built-in self test (BIST) engine for determining whether a fault exists within the circuitry and for programming the at least one eFuse to invoke the redundant circuitry in response to a fault being determined to exist, and
   wherein the eFuse is programmed by an RF signal received by the at least one RF antenna.

* * * * *